March 29, 1966 H. SCHOEN 3,243,718

COMPENSATED AMPLIFIER HAVING LOW INPUT IMPEDANCE

Filed June 25, 1963

INVENTOR.
HERMANN SCHOEN
BY
AGENT

United States Patent Office 3,243,718
Patented Mar. 29, 1966

3,243,718
COMPENSATED AMPLIFIER HAVING LOW INPUT IMPEDANCE

Hermann Schoen, Hamburg, Germany, assignor to North American Philips Company, Inc., New York, N.Y., a corporation of Delaware Filed June 25, 1963, Ser. No. 290,361
Claims priority, application Germany, June 28, 1962, P 29,706
9 Claims. (Cl. 330—17)

The invention relates to an amplifier having a negligible dynamic input resistance. Such amplifiers may be used, for example, in differentiating circuits for electrical voltages wherein an RC section is employed in which a capacitor acts as the differentiating member and the resistance is the input impedance of a transistor operating in common base configuration with such a circuit, alternating currents may be measured without producing a voltage drop. The current flowing through the capacitance is proportional to the differential quotient of the applied voltage only if the circuit includes no ohmic resistances.

The requirements to be satisfied by an amplifier in such a circuit are linearity, a high degree of constancy of the amplification and of the compensation of the input resistance in time, and usability within a maximum frequency range.

It is, therefore, an object of the present invention to provide a novel amplifier circuit.

It is a further object of the present invention to provide a novel amplifier circuit having a negligible dynamic input resistance.

The novel amplifier satisfies the required conditions with the help of few circuit components. A second complementary transistor is connected to the output of the amplifier input stage transistor, which stage is operated in common base configuration, having a resistor included in its base lead.

Figure 1:
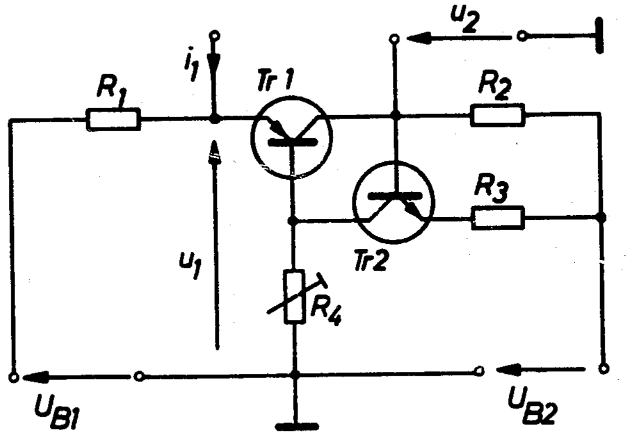
Figure 2:
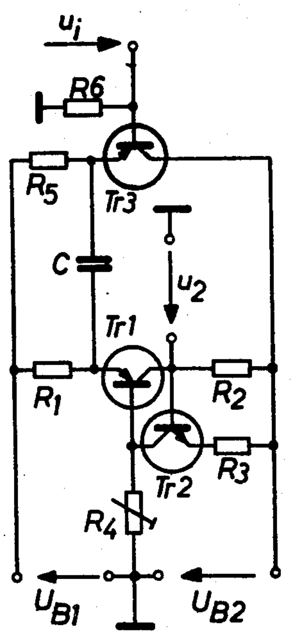

In order that the above objects of the invention may readily be carried into effect, an embodiment thereof will now be described, by way of example, with reference to the accompanying diagrammatic drawings, in which:

FIG. 1 is a circuit diagram of an amplifier in accordance with the invention, and FIG. 2 is a circuit digram of a more elaborate embodiment.

In FIG. 1, a resistor $R_1$ together with a voltage source $U_{B1}$ determines the emitter direct current of a transistor $Tr_1$. This resistor is of much larger value than the (dynamic) input resistance of the transistor $Tr_1$ in order to ensure high stability of the operating point. The collector circuit of this transistor includes the parallel connection of a resistor $R_2$ and of the input of a compensating amplifier. This amplifier is a transistor $Tr_2$ provided with a high degree of negative feedback by a resistor $R_3$. This transistor is of a type complementary to the type of the transistor $Tr_1$. The great advantage of such a circuit arrangement consists in that the compensating amplifier can be directly connected to the main amplifier. Thus, difficulties due to coupling elements (for Example C coupling), especially at low frequencies, are avoided. At the same time, the direct coupling ensures that a variation of the operating point of the main amplifier gives rise to a variation in the same sense of the operating point of the compensating amplifier. Consequently, the compensation of the dynamic input resistance of the transistor $Tr_1$ is maintained even, in such cases.

The collector current of the transistor $Tr_2$ flows through a resistor $R_4$ connected to the base lead of transistor $Tr_1$. The required voltages are supplied by sources $U_{B1}$ and $U_{B2}$.

The input current is shown as $i_1$ and the useful voltage $u_2$ appears at the output. These two quantities have to be proportional to one another. Furthermore, the voltage $u_1$ set up at the input should tend towards the value zero.

With respect to the relationship between the voltages $u_2$ and $u_1$, a relation between the internal and external transistor resistances can be deduced. Since it provides no difficulty to choose $R_2$ and $R_3$ so large that the base resistance and the emitter resistance of the transistor $Tr_2$ can be neglected, and since it may further be assumed that the current amplification factor $\alpha \approx 0.98$, one obtains with a very good approximation:

$$\frac{u_2}{i_1} \approx \alpha_1 \cdot R_2$$

Hence, the amplification of the arrangement depends not only upon the resistance $R_2$, but also upon the current amplification $\alpha_1$ of the first transistor. However, the relative variations of the parameter are generally extremely small.

The compensating voltage for the input resistance is produced as a voltage drop across the resistor $R_4$ by the collector current of the transistor $Tr_2$. In order to prevent the compensation being disturbed by the base current of the first transistor, the collector current of the transistor $Tr_2$ must be of the same order of magnitude as the current $i_1$. This may be achieved, for example, by making $R_3$ equal to $R_2$. The resistor $R_3$ provides a high degree of negative feedback for the second transistor $Tr_2$, so that the amplification of this stage is largely independent of the properties of the transistor.

In order to ensure corresponding behaviour of the two transistors, they are preferably operated with about the same quiescent or rest current. This is obtained by making the resistors $R_2$ and $R_3$ equal to one another. In this case, compensation is achieved by adjusting $R_4$ to a value approximately equal to the input resistance of the transistor $Tr_1$.

An additional resistor, such as the internal resistance of the voltage source $U_{B1}$ connected in series with the emitter resistance of the transistor $Tr_1$ can furthermore be included in the compensation. For this purpose, the value of the resistor $R_4$ must be correspondingly increased in order to compensate for the additional resistance.

This possibility is of great importance for the differentiating circuit. It enables the adverse influence of the internal resistance of the voltage source to be eliminated, so that $i_1$ is exactly proportional to the differential quotient or rate of change $du_1/dt$ of the e.m.f.

The upper frequency limit approaches $f_\alpha$, because both transistors are practically operated in common base connection.

FIG. 2 shows a more elaborate embodiment of the arrangement shown in FIG. 1. It includes a further transistor stage operating in common collector connection. The emitter of this transistor is connected to the input terminal of the circuit arrangement shown in FIG. 1 through a capacitor C. The input signal $u_i$ is now applied between earth and base of the preceding stage. In this case, the output signal $u_2$ is exactly proportional to the differential quotient $du_i/dt$ of $u_i$ if $R_4$ is chosen so that the dynamic internal resistance of the preliminary-stage transistor is included in the resistance compensation.

If it is ensured that the internal resistance $R_i$ of the source of voltage to be differentiated is materially larger than $R_6$, the dynamic input resistance $R_{1\,dyn}$ and hence the behaviour of this differentiating circuit become independent of $R_i$. This is a requirement which an ideal differentiating stage has to satisfy.

Instead of the transistor, a tube connected in common anode connection may also be used. Since the control of such a stage is effected without power consumption, the dynamic internal resistance of the stage is rendered independent of the internal resistance of the control source $u_1$ without fulfilling additional conditions.

While several alternative embodiments of the invention have been indicated and described above, it will be apparent to those skilled in the art that other modifications may be made without departing from the scope of the invention as set forth in the appended claims.

What is claimed is:

1. An amplifier having a relatively low dynamic input resistance comprising first and second active stages each having an input electrode, a common electrode and an output electrode, the common electrode of said first stage and the output electrode of said second stage being commonly connected at a first point, the output electrode of said first stage and the common electrode of said second stage being commonly connected at a second point, first means for applying a reference potential, first impedance means connected between said first point and said first potential applying means, second means for applying an operating potential, second impedance means connected between the input electrode of said second stage and said second potential applying means for providing negative feedback to said second stage, and third impedance means connected between said second point and said second potential applying means, thereby to produce an output voltage across said third impedance means proportional to the input current at the input electrode of said first stage.

2. The combination of claim 1 wherein said second and third impedance means are substantially of the same order of magnitude.

3. The combination of claim 2 wherein each of said stages comprise a transistor connected in common base configuration.

4. A compensated amplifier comprising, a first active stage having an input electrode, a common electrode, and an output electrode, a second active stage having an input electrode, a common electrode, and an output electrode, first means for applying a reference potential, a first impedance means coupling the common electrode of said first stage and the output electrode of said second stage to said first potential applying means, second means for applying a first operating potential, second impedance means coupling the output electrode of said first stage and the common electrode of said second stage to said second potential applying means, third impedance means coupling the input electrode of said second stage to said second potential applying means, said third impedance means providing negative feedback to said second stage, third means for applying a second operating potential, and fourth impedance means coupling the input electrode of said first stage to said third means thereby to produce an output voltage proportional to the input current of said first stage across said second impedance means.

5. The combination of claim 4 wherein each of said stages comprises a transistor connected in common base configuration.

6. A compensated amplifier comprising, a first active stage having an input electrode, a common electrode, and an output electrode, a second active stage having an input electrode, a common electrode, and an output electrode, first means for applying a reference potential, a first impedance means coupling the common electrode of said first stage and the output electrode of said second stage to said first potential applying means, second means for applying a first operating potential, second impedance means coupling the output electrode of said first stage and the common electrode of said second stage to said second potential applying means, third impedance means coupling the input electrode of said second stage to said second potential applying means, said third impedance means providing negative feedback to said second stage, third means for applying a second operating potential, fourth impedance means coupling the input electrode of said first stage to said third potential applying means thereby to produce an output voltage proportional to the input current of said first stage across said second impedance means, a third active stage having an input electrode, a common electrode, and an output electrode, fifth impedance means coupling the input electrode of said third stage to said first potential applying means, sixth impedance means coupling the output electrode of said third stage to said third potential applying means, and means coupling the common electrode of said third stage to said second potential applying means, and capacitive means coupling the output electrode of said third stage to the input electrode of said first stage.

7. The combination of claim 6 wherein each of said first and second stages comprises a transistor connected in common base configuration and said third stage comprises a transistor connected in common collector configuration.

8. A compensated amplifier comprising, a first transistor having an emitter electrode, a base electrode, and a collector electrode, a second transistor of opposite conductivity type having an emitter electrode, a base electrode, and a collector electrode, first means for applying a reference potential, a first impedance means connecting the base electrode of said first transistor and the collector electrode of said second transistor to said first potential applying means, second means for applying a first operating potential, second impedance means connecting the collector electrode of said first transistor and the base electrode of said second transistor to said second potential applying means, third impedance means connecting the emitter electrode of said second transistor to said second potential applying means for providing negative feedback to said second transistor, third means for applying a second operating potential, and fourth impedance means connecting the emitter electrode of said first transistor to said third potential applying means thereby to produce an output voltage across said second impedance proportional to the input current of said first transistor, said first and second operating potentials forward biasing said second and first transistor, respectively.

9. The combination of claim 8 wherein said second impedance means and said third impedance means are of substantially the same value.

References Cited by the Examiner

UNITED STATES PATENTS

| | | | |
|---|---|---|---|
| 3,040,265 | 6/1962 | Forge | 330—28 |
| 3,171,085 | 2/1965 | Vallese | 330—32 X |

OTHER REFERENCES

Middlebrook, "Design of Transistor Regulated Power Supplies," Proceedings of the IRE, vol. 45, November 1957, TK 5700-17, pp. 1502–1509.

NATHAN KAUFMAN, *Acting Primary Examiner.*

R. LAKE, *Assistant Examiner.*